United States Patent
Pham et al.

(10) Patent No.: US 9,269,611 B2
(45) Date of Patent: Feb. 23, 2016

(54) INTEGRATED CIRCUITS HAVING GATE CAP PROTECTION AND METHODS OF FORMING THE SAME

(71) Applicants: GLOBALFOUNDRIES, Inc., Grand Cayman (KY); INTERNATIONAL BUSINESS MACHINES CORPORATION, Armonk, NY (US)

(72) Inventors: Daniel Thanh Khae Pham, Clifton Park, NY (US); Xiuyu Cai, Niskayuna, NY (US); Bala Subramanian Pranatharthi Haran, Watervliet, NY (US); Charan Veera Venkata Satya Surisetty, Clifton Park, NY (US); Jin Wook Lee, Seoul (KR); Shom Ponoth, Los Angeles, CA (US); David V. Horak, Essex Junction, VT (US)

(73) Assignees: GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/159,944

(22) Filed: Jan. 21, 2014

(65) Prior Publication Data
US 2015/0206844 A1    Jul. 23, 2015

(51) Int. Cl.
*H01L 29/78* (2006.01)
*H01L 21/768* (2006.01)

(52) U.S. Cl.
CPC .... *H01L 21/76816* (2013.01); *H01L 21/76831* (2013.01); *H01L 21/76832* (2013.01); *H01L 21/76877* (2013.01); *H01L 2924/0002* (2013.01)

(58) Field of Classification Search
CPC ............... H01L 21/28052; H01L 21/28518; H01L 21/28097
USPC .......................... 257/382, 384, 388, 412, 413
See application file for complete search history.

(56) References Cited

U.S. PATENT DOCUMENTS

| | | | |
|---|---|---|---|
| 6,576,548 B1 * | 6/2003 | Tu et al. ...................... | 438/640 |
| 2003/0151082 A1 * | 8/2003 | Kim et al. ................... | 257/306 |
| 2006/0138463 A1 * | 6/2006 | Kim et al. ................... | 257/202 |
| 2009/0159956 A1 * | 6/2009 | Asada et al. ................ | 257/321 |
| 2012/0104471 A1 * | 5/2012 | Chang et al. ................ | 257/288 |

\* cited by examiner

*Primary Examiner* — Tan N Tran
(74) *Attorney, Agent, or Firm* — Ingrassia Fisher & Lorenz, P.C.

(57) ABSTRACT

Integrated circuits and methods of forming integrated circuits are provided. An integrated circuit includes a gate electrode structure overlying a base substrate. The gate electrode structure includes a gate electrode, with a cap disposed over the gate electrode and sidewall spacers disposed adjacent to sidewalls of the gate electrode structure. A source and drain region are formed in the base substrate aligned with the gate electrode structure. A first dielectric layer is disposed adjacent to the sidewall spacers. The sidewall spacers and the cap have recessed surfaces below a top surface of the first dielectric layer, and a protecting layer is disposed over the recessed surfaces. A second dielectric layer is disposed over the first dielectric layer and the protecting layer. Electrical interconnects are disposed through the first dielectric layer and the second dielectric layer, and the electrical interconnects are in electrical communication with the respective source and drain regions.

17 Claims, 5 Drawing Sheets

INTEGRATED CIRCUITS HAVING GATE CAP PROTECTION AND METHODS OF FORMING THE SAME

TECHNICAL FIELD

The technical field generally relates to integrated circuits and methods of forming the same, and more particularly relates to integrated circuits with protection of the gate electrode structure during formation of electrical interconnects and methods of forming the same.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

As advanced metal-oxide-semiconductor (MOS) technology continues to scale and move into the deep-sub-micron geometry dimensions, fabrication of fine features in the semiconductor ICs presents difficulties. One particular difficulty is presented by electrical interconnect formation through dielectric layers to connect to source and drain regions of the FETs. Conventional techniques that are employed to form the electrical interconnects often compromise the gate electrode structure. For example, a nitride cap may be formed over the gate electrode structure prior to via etching through the dielectric layers with the electrical interconnects formed in the vias. However, both oxide and nitride dielectric layers generally overly the source and drain regions, and the vias must be etched through both the oxide and nitride dielectric layers to properly connect the source and drain regions to the electrical interconnect. Because the nitride cap is susceptible to nitride etch, and because conventional oxide etchants also generally etch nitrides (albeit at a significantly lesser rate than oxides), the nitride cap is prone to etch-through especially when a ratio of dielectric layer thickness to nitride cap thickness is high. As a result, the gate electrode structure underlying the nitride cap may be compromised, resulting in device reliability concerns. While steps may be taken to protect the nitride cap during etching of the vias to form the electrical interconnects, any added layers over the dielectric layer and nitride cap must still be etched during via formation such that nitride cap etch-through may still be a concern. Further, the additional of further layers over the nitride cap may impact performance of the FETs.

Accordingly, it is desirable to provide integrated circuits and methods of forming integrated circuits with adequate protection of the gate electrode structure while enabling the electrical interconnects to be properly formed. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits and methods of forming integrated circuits are provided herein. In an embodiment, an integrated circuit includes a gate electrode structure that overlies a base substrate. The gate electrode structure includes a gate electrode. A cap is disposed over the gate electrode. Sidewall spacers are disposed adjacent to sidewalls of the gate electrode structure. A source region and a drain region are formed in the base substrate aligned with the gate electrode structure. A first dielectric layer is disposed adjacent to the sidewall spacers. The sidewall spacers and the cap have recessed surfaces below a top surface of the first dielectric layer. A protecting layer is disposed over the recessed surfaces of the sidewall spacers and the cap. A second dielectric layer is disposed over the first dielectric layer and over the protecting layer. Electrical interconnects are disposed through the first dielectric layer and the second dielectric layer, and the electrical interconnects are in electrical communication with the respective source region and the drain region.

In another embodiment, a method of forming an integrated circuit includes providing a gate electrode structure overlying a base substrate with sidewall spacers disposed adjacent to sidewalls of the gate electrode structure. A cap is disposed over the gate electrode structure, and a source region and a drain region are formed in the base substrate aligned with the gate electrode structure. A first dielectric layer is disposed adjacent to the sidewall spacers. The sidewall spacers and the cap are etched to form recessed surfaces of the sidewall spacers and the cap below a top surface of the first dielectric layer. A protecting layer is formed over the recessed surfaces of the sidewall spacers and the cap. A second dielectric layer is formed over the first dielectric layer and over the protecting layer. Vias are etched through the second dielectric layer and the first dielectric layer over the source region and the drain region. Electrically-conductive material is deposited in the vias to form electrical interconnects. The electrical interconnects are disposed in the first dielectric layer and the second dielectric layer and are in electrical communication with the respective source region and the drain region.

In another embodiment, a method of forming an integrated circuit includes providing a gate electrode structure overlying a base substrate with sidewall spacers disposed adjacent to sidewalls of the gate electrode structure. A source region and a drain region are formed in the base substrate aligned with the gate electrode structure. A first dielectric layer is disposed adjacent to the sidewall spacers. The gate electrode structure includes a gate electrode that has an offset surface at a depth below top surfaces of the sidewall spacers and the first dielectric layer. A cap material is deposited over the gate electrode, the sidewall spacers, and the first dielectric layer. Portions of the cap material that overlie the sidewall spacers and the first dielectric layer are removed to form a cap that overlies the gate electrode structure. The sidewall spacers and the cap are etched to form recessed surfaces below a top surface of the first dielectric layer. A protecting material is deposited over the recessed surfaces of the sidewall spacers and the cap and over the top surface of the first dielectric layer. Portions of the protecting material are selectively removed from the top surface of the first dielectric layer, with a protecting layer remaining over the recessed surfaces of the sidewall spacers and the cap. A second dielectric layer is formed over the first dielectric layer and over the protecting layer. Vias are etched through the second dielectric layer and the first dielectric layer over the source region and the drain region. Electrically-conductive material is deposited in the vias to form electrical interconnects. The electrical interconnects are disposed in the first dielectric layer and the second dielectric layer and are in electrical communication with the respective source region and the drain region.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Integrated circuits and methods of forming integrated circuits are provided herein that enable adequate protection of a gate electrode structure in the integrated circuits while also enabling the electrical interconnects to be properly formed. In particular, a protecting layer is disposed over a cap that overlies the gate electrode structure, as well as over sidewall spacers that are disposed adjacent to the gate electrode structure. The "protecting layer", as referred to herein, is a layer of material that has a lower etch rate in nitride etchants and oxide etchants than silicon nitride and silicon oxide, respectfully. The sidewall spacers and the cap have recessed surfaces that are below a top surface of a first dielectric layer that is disposed adjacent to the sidewall spacers. As referred to herein, "below the top surface" refers to a relative position that is closer to a base substrate than the top surface of the first dielectric layer. The protecting layer is specifically disposed over the recessed surfaces of the sidewall spacers and the cap, with the recessed configuration of the recessed surfaces enabling the protecting layer to be formed by deposition of protecting material over the top surface of the first dielectric layer and over the recessed surfaces of the sidewall spacers and the cap, followed by selectively removing portions of the protecting material from the top surface of the first dielectric layer, with the protecting material remaining over the recessed surfaces of the sidewall spacers and the cap to form the protecting layer during formation of the integrated circuit. In this manner the protecting layer may remain disposed over the recessed surfaces of the sidewall spacers and the cap to provide protection to the sidewall spacers and the cap during via etching through the first dielectric layer and through an optional nitride layer, with via etching employed to form electrical interconnects through the first dielectric layer that is adjacent to the sidewall spacers. Even if portions of the protecting layer are exposed to etchants during via etching, because the protecting layer has a lower etch rate in nitride etchants and oxide etchants that are generally used during via etching, the protecting layer sufficiently shields the cap and sidewall spacers to prevent the gate electrode structure from being exposed during etching.

An exemplary method of forming an integrated circuit will now be described with reference to FIGS. 1-6, which show a portion of the integrated circuit including a single transistor and an embodiment for its fabrication although it is to be appreciated that millions of the transistors may be included in the integrated circuit. In accordance with the embodiments described herein, the transistors can be either n-channel metal oxide semiconductor (NMOS) transistors or p-channel metal oxide semiconductor (PMOS) transistors. The complete integrated circuit can include NMOS transistors, PMOS transistors, or can be CMOS integrated circuits that include both types. The described embodiments of the methods of forming the integrated circuits can be applied to any or all of the transistors in the integrated circuit.

Figure 1:
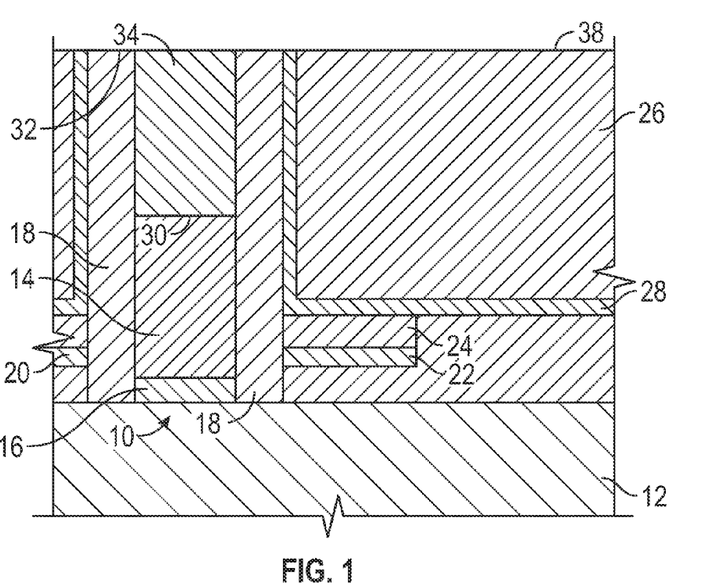
FIG. 1 is a schematic cross-sectional side view of an integrated circuit in accordance with an embodiment.

The methods described herein are compatible with either gate first technology or replacement gate technology. The embodiments described herein can be implemented on either a base substrate that includes a bulk semiconductor wafer or an SOI substrate. For purposes of illustration only, but without limitation, the embodiment of the method of forming the integrated circuit shown in FIGS. 1-6 is illustrated with gate first technology on the base substrate that includes a bulk semiconductor wafer having fins upon which the transistor is formed. In an embodiment and as shown in FIG. 1, a gate electrode structure 10 is provided overlying a base substrate 12. The gate electrode structure 10, as referred to herein, includes a gate electrode 14 and a gate insulator 16. It is to be appreciated that although single layers are shown for the gate electrode 14 and the gate insulator 16, multiple layers may be employed to form the gate electrode 14 and the gate insulator 16 in accordance with convention techniques and gate electrode structure configurations. The base substrate 12, as referred to herein, is any substrate that underlies a gate electrode structure 10. The base substrate 12 generally includes a semiconductor material such as, but not limited to, silicon, germanium, a III-V material such as gallium arsenide, or other semiconductor material. Although not shown, the base substrate 12 may also include multiple layers in accordance with convention configurations of substrates that include gate electrode structures disposed thereon.

A cap 34 is disposed over the gate electrode structure 10 to protect the gate electrode 14 during subsequent via etching, as described in further detail below. The cap 34 may be formed over the gate electrode 14 through various conventional techniques, including but not limited to bottom-up filling technique or through blanket deposition of cap material over exposed surfaces. Atomic layer deposition (ALD) and chemical vapor deposition (CVD) are examples of blanket deposition techniques. For purposes of the embodiment shown in FIGS. 1-6, ALD is employed to form the cap 34, resulting in a generally even surface contour whereas CVD generally results in an uneven surface contour and is addressed in further detail below in the embodiment shown in FIGS. 7-9.

As also shown in FIG. 1, sidewall spacers 18 are disposed adjacent to sidewalls of the gate electrode structure 10, and a source region 20 and a drain region 22 are formed in the base substrate 12 aligned with the gate electrode structure 10. A silicide layer 24 is formed over the source region 20 and the drain region 22, and a first dielectric layer 26 is disposed adjacent to the sidewall spacers 18. As referred to herein, the first dielectric layer 26 is a layer of dielectric material that is formed prior to forming a protecting layer over the cap 34, as described in further detail below. Conventional techniques may be employed for forming the sidewall spacers 18, the source region 20 and the drain region 22, the silicide layer 24, and the first dielectric layer 26. The cap 34 generally includes a nitride material such as, but not limited to, silicon nitride. The sidewall spacers 18 also generally include a nitride material, which may be the same as or different from the nitride material of the cap 34. The first dielectric layer 26 includes a first dielectric material. In an embodiment, the first dielectric material includes an oxide material such as, for example, a silicon oxide. As shown in FIG. 1, the gate electrode 14 has an offset surface 30 at a depth below top surfaces 32, 38 of the sidewall spacers 18 and the first dielectric layer 26.

In an embodiment and although not shown, a dummy gate is first formed and a nitride cap is formed over the dummy gate, followed by patterning. The sidewall spacers 18 are formed adjacent to sides of the dummy gate and nitride cap, followed by forming the first dielectric layer 26. The nitride cap and dummy gate are then etched away with appropriate etchants through conventional techniques and the gate electrode structure 10 is formed between the sidewall spacers 18. The cap 34 is then formed over the gate electrode structure, resulting in the configuration shown in FIG. 1.

In an embodiment and as shown in FIG. 1, a nitride layer 28 is disposed over the sidewall spacers 18 and the silicide layer 24, with the first dielectric layer 26 formed over the nitride layer 28. Suitable nitrides for the nitride layer 28 include, but are not limited to, silicon nitride. The nitride layer 28 provides an etch-stop during via formation through the first dielectric layer 26, as described in further detail below, and protects the silicide layer 24 from oxidation during etching of the first dielectric layer 26. In another embodiment and although not shown, the first dielectric layer 26 is disposed directly upon the base substrate 12 and directly over and upon the silicide layer 24 that is disposed over the source region 20 and the drain region 22, under which circumstances the nitride layer 28 may be omitted.

Figure 2:
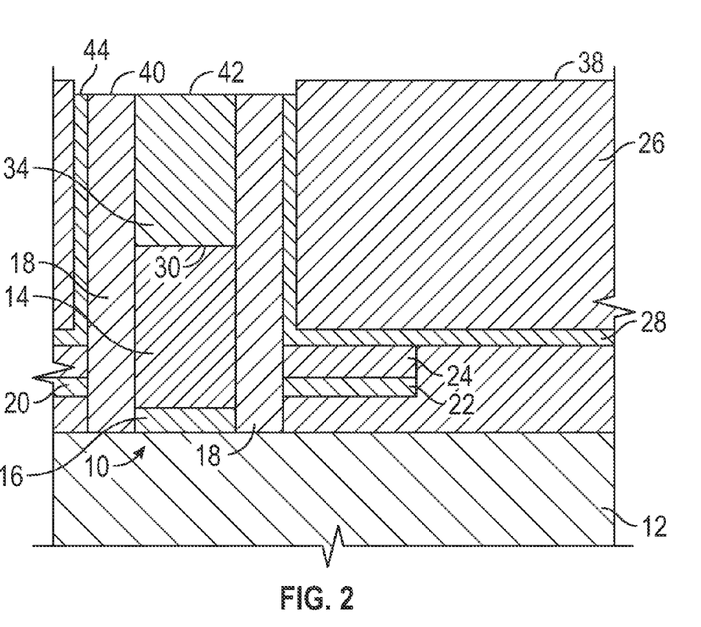
FIGS. 2-6 are schematic cross-sectional side views of a method of forming the integrated circuit of FIG. 1 in accordance with an embodiment.

Referring to FIG. 2, the sidewall spacers 18 and the cap 34 are etched to form recessed surfaces 40, 42 of the sidewall spacers 18 and the cap 34, respectively, below the top surface 38 of the first dielectric layer 26. In embodiments, the cap 34 and the sidewall spacers 18 include nitride material, and an appropriate nitride etchant may be employed to selectively etch the cap 34 and the sidewall spacers 18 at a higher rate than the first dielectric layer 26, which includes the oxide material. An example of a suitable nitride etchant includes, but is not limited to, phosphoric acid. In embodiments where the nitride layer 28 is present and as shown in FIG. 2, the nitride layer 28 is also etched along with the sidewall spacers 18 and the cap 34 to form a recessed surface 44 of the nitride layer 28. After etching, the recessed surface 44 of the nitride layer 28 is generally on an even plane with the recessed surfaces 40, 42 of the sidewall spacers 18 and the cap 34, respectively. The first dielectric layer 26 has the top surface 38 that remains higher than the recessed surfaces 40, 42 after etching, i.e., the top surface 38 is spaced further from the base substrate 12 than the recessed surfaces 40, 42, 44. The different relative heights of the recessed surfaces 40, 42, 44 and the top surface 38 of the first dielectric layer 26 enable selective formation of the protecting layer over the sidewall spacers 18 and the cap 34, as well as over the recessed surface 44 of the nitride layer 28, as described in further detail below. The offset surface 30 of the gate electrode 14 is at a depth below the recessed surfaces 40, 42 of the sidewall spacers 18 and the cap 34 such that the cap 34 and the sidewall spacers 18 still encase the gate electrode structure 10 even after etching to form the recessed surfaces 40, 42.

Figure 3:
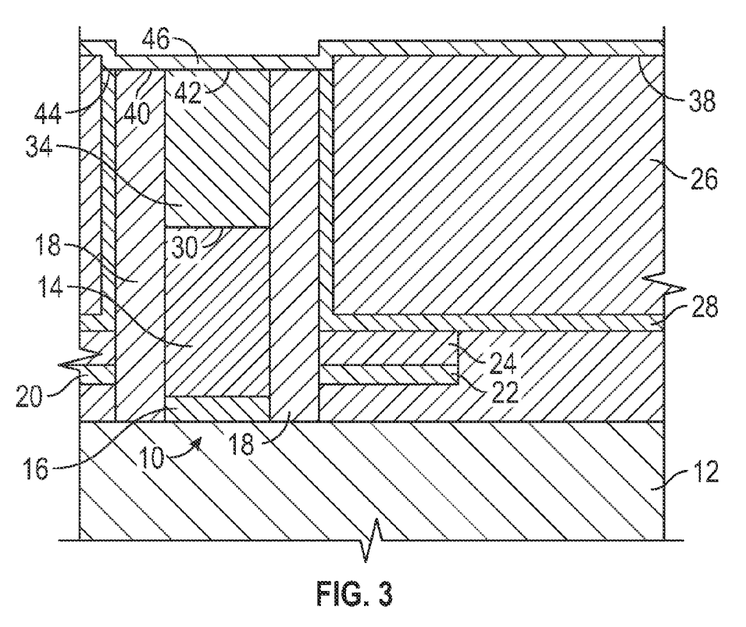
Figure 4:
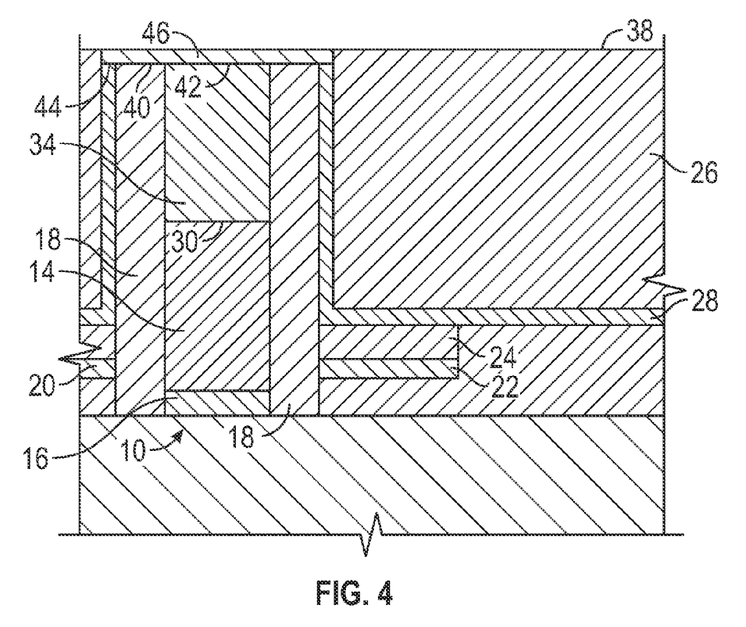

In an embodiment and as shown in FIGS. 3 and 4, a protecting layer 46 is formed over the recessed surfaces 40, 42 of the sidewall spacers 18 and the cap 34. In the embodiment shown in FIGS. 3 and 4, the protecting layer 46 is also formed over the recessed surface 44 of the nitride layer 28. In an embodiment and as shown in FIG. 3, to form the protecting layer 46, a protecting material is deposited over the recessed surfaces 40, 42 of the sidewall spacers 18 and the cap 34 and over the top surface 38 of the first dielectric layer 26. The protecting material may be deposited through ALD, which is a conformal process that is capable of evenly depositing the protecting material over the cap 34 even under conditions where the cap 34 has a rough surface contour. Portions of the protecting material are then selectively removed from the top surface 38 of the first dielectric layer 26, with the protecting material remaining over the recessed surfaces 40, 42 of the sidewall spacers 18 and the cap 34 to form the protecting layer 46 as shown in FIG. 4. Because the recessed surfaces 40, 42 are recessed below the top surface 38 of the first dielectric layer 26, the protecting material on the top surface 38 of the first dielectric layer 26 may be removed, for example, by CMP without removing the protecting material from the recessed surfaces 40, 42, 44.

As set forth above, the protecting layer 46 is a layer of material that has a lower etch rate in nitride etchants and oxide etchants than silicon nitride and silicon oxide, respectfully. In this regard, etchants that are suitable for etching the first dielectric layer 26 (which generally includes silicon oxide) and for etching the optional nitride layer 28 (which generally includes silicon nitride) are ineffective to etch through the protecting layer 46. In embodiments, the protecting layer 46 includes the protecting material that has an etch rate that is measurably slower, such as at least 50 percent slower, than etch rates of materials included in the first dielectric layer 26 and the nitride layer 28. In embodiments, the protecting layer 46 includes a high-k material. As referred to herein, "high-k material", or high dielectric constant material, is a material that has a dielectric constant that is greater than silicon (dielectric constant of 3.7). Examples of suitable high-k dielectric materials include, but are not limited to, hafnium oxide, lanthanum oxide, zirconium oxide, tungsten oxide, iridium oxide, aluminum oxide, and the like. In one specific embodiment, the high-k dielectric material is hafnium oxide. In other embodiments, the protecting layer 46 may include a carbon-containing silicon material. Examples of suitable carbon-containing silicon material include, but are not limited to, SiC, SiOC, and SiNC. Thickness of the protecting layer 46 is not particularly limited, provided that via etching does not completely remove or breach the protecting layer 46. In embodiments, the protecting layer 46 has a thickness of from about 10 Å to about 30 Å, such as from about 17 Å to about 24 Å. Etching of the sidewall spacers 18 and the cap 34 may be controlled to achieve a desired thickness of the protecting layer 46 after removal of the protecting material from over the top surface 38 of the first dielectric layer 26.

Figure 5:
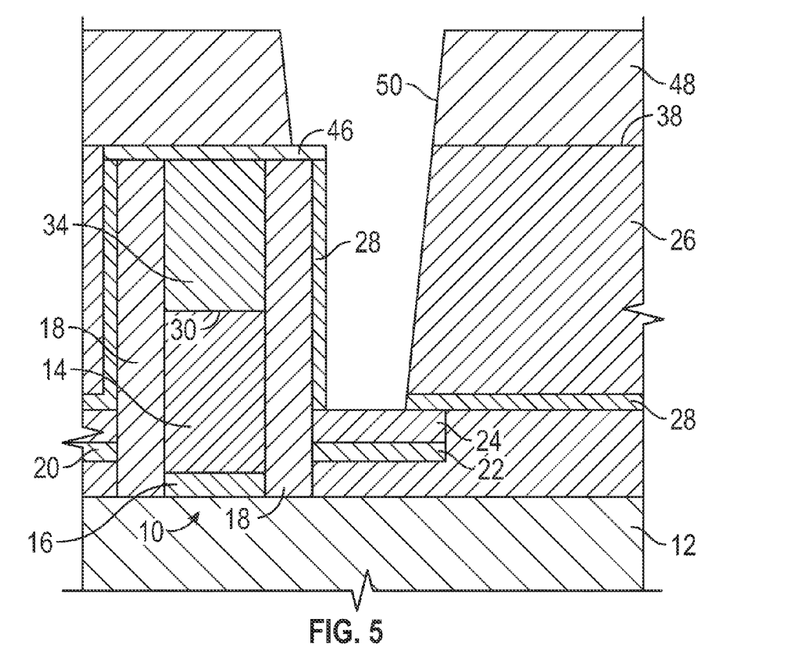
Figure 6:
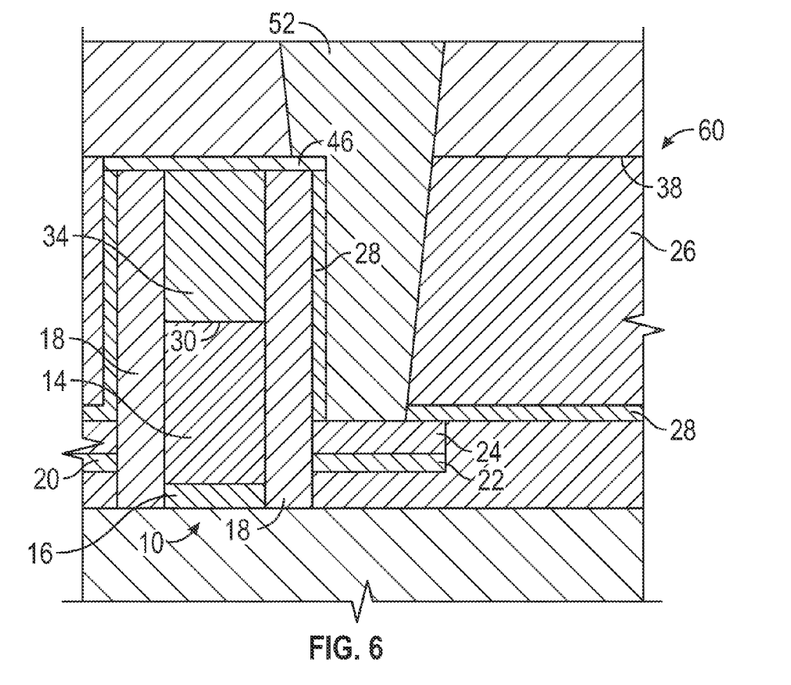

After forming the protecting layer 46 and as shown in FIG. 5, a second dielectric layer 48 may be formed over the first dielectric layer 26 and over the protecting layer 46. The second dielectric layer 48 may be formed from a second dielectric material that is the same as or different than the first dielectric material that is described above for the first dielectric layer 26. The second dielectric layer 48 effectively covers and insulates underlying features and provides a medium through which electrical interconnects may be formed to facilitate electrical connection between devices in the integrated circuit. In particular, vias 50 are etched through the second dielectric layer 48 and the first dielectric layer 26 over the source region 20 and the drain region 22, although FIG. 5 only shows one via 50 etched over the drain region 22 for illustrative purposes. Because the first dielectric layer 26 and the second dielectric layer 48 generally include an oxide material, the oxide etchant may be employed for etching the via 50 through the second dielectric layer 48 and the first dielectric layer 26, with the nitride layer 28 functioning as an etch-stop to prevent overetch into the silicide layer 24. After exposing the nitride layer 28 in the via 50, the nitride etchant may be employed for completing via etching and to expose the surface of the silicide layer 24. Due to the presence of the protecting layer 46 over the recessed surfaces 40, 42, 44 of the sidewall spacers 18, the cap 34, and the nitride layer 28, via etching may be effectively completed without punch-through of the sidewall spacers 18 and cap 34 into the gate electrode 14. After via etching and as shown in FIG. 6, the vias 50 may be filled with an electrically-conductive material, such as copper, to form electrical interconnects 52 that are disposed through the first dielectric layer 26 and second dielectric layer 48 and that are in electrical communication with the respective source region 20 and the drain region 22 and to form an integrated circuit 60. Conventional front-end-of-line (FEOL) and back-end-of-line (BEOL) processing may ensue to complete formation of the integrated circuit 60 as desired.

Figure 7:
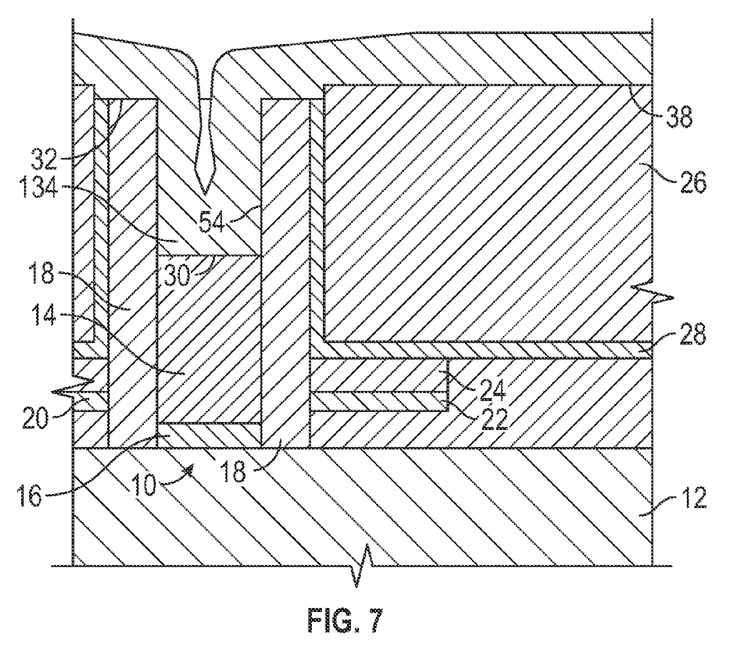
FIGS. 7-9 are schematic cross-sectional side views of another method of forming an integrated circuit in accordance with another embodiment.
Figure 8:
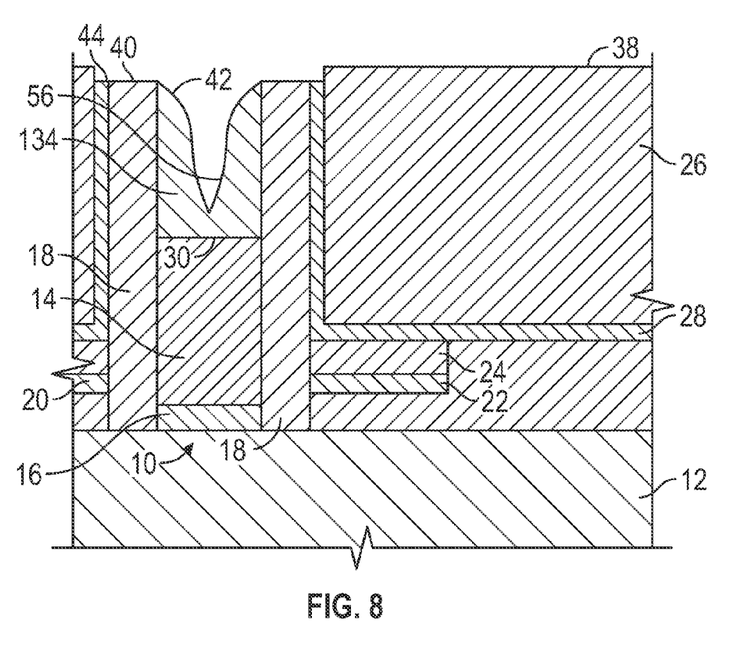
Figure 9:
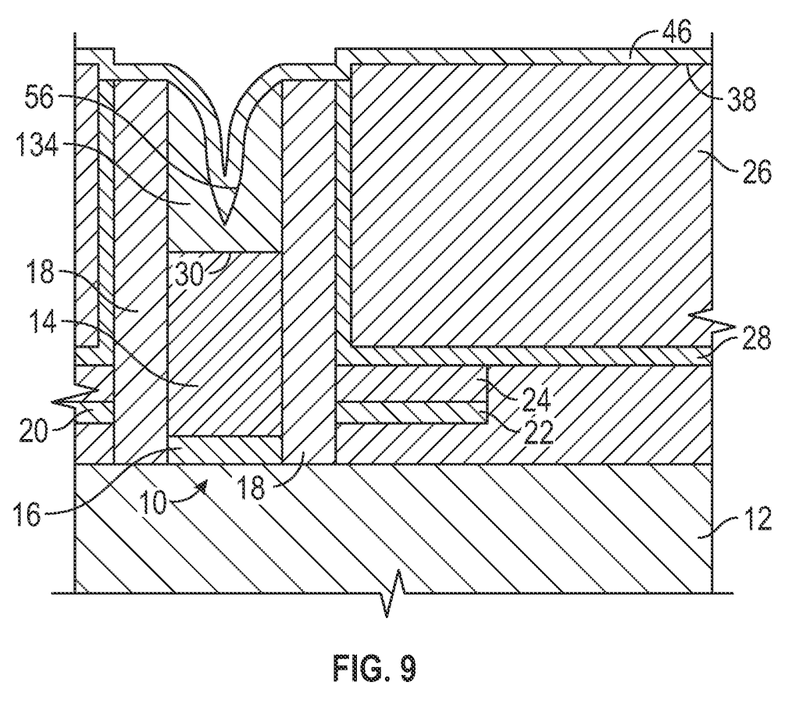

Another embodiment of a method of forming an integrated circuit will now be described with reference to FIGS. 7-9. In this embodiment, a replacement metal gate (RMG) technique may be employed to form the gate electrode structure, with the gate electrode structure 10 formed between the sidewall spacers 18 after formation of the sidewall spacers 18, after formation of the nitride layer 28, and after formation of the first dielectric layer 26 adjacent to the sidewall spacers 18 and over the nitride layer 28. The gate electrode 14 has the offset surface 30 at a depth below top surfaces 32, 38 of the sidewall spacers 18 and the first dielectric layer 26, with a gap 54 defined over the offset surface 30 and between the sidewall spacers 18. In this embodiment, a cap 134 is formed by depositing a cap material through chemical vapor deposition (CVD), which may be plasma-enhanced (PECVD), with the cap material deposited in the gap 54 and also over the top surfaces 32, 38 of the sidewall spacers 18 and the first dielectric layer 26.

Portions of the cap material that overly the sidewall spacers 18 and the first dielectric layer 26 may be removed, such as through CMP of the cap material to the top surfaces 32, 38 of the sidewall spacers 18 and the first dielectric layer 26, respectfully, to form the cap 134 overlying the gate electrode structure 10. As shown in FIG. 8 and as described above, the sidewall spacers 18 and the cap 134 may be etched to form the recessed surfaces 40, 42 of the sidewall spacers 18 and the cap 134. However, because CVD is a conformal process, a seam 56 may be formed in the resulting cap 134 over the gate electrode 14 due to uneven deposition of the cap material as shown in FIG. 8. As a result, in this embodiment, the cap 134 has a non-planar configuration. The seam 56 is vulnerable to etching during via formation through the first dielectric layer 26 and the nitride layer 28, and such etching could expose the gate electrode 14. Referring to FIG. 9, the protecting layer 46 is formed through ALD, which is effective to conformally cover the cap 134 even when the seam 56 is formed. Subsequent via etching through the seam 56 is effectively avoided due to presence of the protecting layer 46 that is formed through ALD. The method may proceed in the same manner as described above in the embodiment shown in FIGS. 4-6 to form the integrated circuit 60.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An integrated circuit comprising:
   a gate electrode structure overlying a base substrate, wherein the gate electrode structure comprises a gate electrode and a cap disposed over the gate electrode;
   sidewall spacers disposed adjacent to sidewalls of the gate electrode structure;
   a source region and a drain region formed in the base substrate adjacent the gate electrode structure;
   a silicide layer disposed over the source region and the drain region;
   a nitride layer formed over the sidewall spaces and the silicide layer;
   a first dielectric layer disposed adjacent to the sidewall spacers, wherein the sidewall spacers, the cap, and the nitride layer is disposed between the first dielectric layer and the sidewall spaces and the silicide layer;
   a protecting layer disposed over the recessed surfaces of the sidewall spacers, the cap; and the nitride layer;
   a second dielectric layer disposed over the first dielectric layer and over the protecting layer;
   electrical interconnects disposed through the first dielectric layer and the second dielectric layer and in electrical communication with the respective source region and the drain region.

2. The integrated circuit of claim 1, wherein the top surface of the first dielectric layer is free from the protecting layer.

3. The integrated circuit of claim 1, wherein the protecting layer comprises a high-k material.

4. The integrated circuit of claim 3, wherein the high-k material is chosen from hafnium oxide, lanthanum oxide, zirconium oxide, tungsten oxide, iridium oxide, aluminum oxide.

5. The integrated circuit of claim 1, wherein the protecting layer comprises a carbon-containing silicon material.

6. The integrated circuit of claim 1, wherein the protecting layer has a thickness of from about 10 Å to about 30 Å.

7. The integrated circuit of claim 1, wherein the gate electrode has an offset surface at a depth below the recessed surfaces of the sidewall spacers and the cap.

8. The integrated circuit of claim 1, wherein the first dielectric layer comprises an oxide material.

9. The integrated circuit of claim 1, wherein the cap comprises a nitride material.

10. The integrated circuit of claim 1, wherein the protecting layer is only disposed on the recessed surfaces of the sidewall spacers, the cap, and the nitride layer.

11. The integrated circuit of claim 1, wherein the recessed surfaces of the sidewall spacers, the cap, and the nitride layer are generally on an even plane.

12. An integrated circuit comprising:
   a gate electrode structure overlying a base substrate, wherein the gate electrode structure comprises a gate electrode and a cap disposed over the gate electrode;
   sidewall spacers disposed adjacent to sidewalls of the gate electrode structure;
   a source region and a drain region formed in the base substrate adjacent the gate electrode structure;

a first dielectric layer disposed adjacent to the sidewall spacers, wherein the sidewall spacers and the cap have recessed surfaces below a top surface of the first dielectric layer with a gap defined in the first dielectric layer over the recessed surfaces of the sidewall spacers and the cap and with the recessed surfaces of the sidewall spacers and the cap exposed in the gap;

a protecting layer disposed over the recessed surfaces of the sidewall spacers and the cap, within the gap in the first dielectric layer;

a second dielectric layer disposed over the first dielectric layer and over the protecting layer; and electrical interconnects disposed through the first dielectric layer and the second dielectric layer and in electrical communication with the respective source region and the drain region.

13. The integrated circuit of claim 12, further comprising:
a silicide layer disposed over the source region and the drain region;
a nitride layer formed over the sidewall spacers and the silicide layer;
wherein the nitride layer has a recessed surface below a top surface of the first dielectric layer with the recessed surface of the nitride layer exposed in the gap, and wherein the nitride layer is disposed between the first dielectric layer and the sidewall spacers and the silicide layer; and
wherein the protecting layer is further disposed over the recessed surface of the nitride layer in the gap.

14. An integrated circuit comprising:
a gate electrode structure overlying a base substrate, wherein the gate electrode structure comprises a gate electrode and a cap disposed over the gate electrode;
sidewall spacers disposed adjacent to sidewalls of the gate electrode structure;
a source region and a drain region formed in the base substrate adjacent the gate electrode structure;
a first dielectric layer disposed adjacent to the sidewall spacers, wherein the sidewall spacers and the cap have recessed surfaces below a top surface of the first dielectric layer;
a protecting layer disposed over the recessed surfaces of the sidewall spacers and the cap;
a second dielectric layer disposed over the first dielectric layer and over the protecting layer; and
electrical interconnects disposed through the first dielectric layer and the second dielectric layer and in electrical communication with the respective source region and the drain region, wherein the electrical interconnects do not extend through the protecting layer.

15. The integrated circuit of claim 14, wherein vias are defined through the first dielectric layer and the second dielectric layer, over the source region and the drain region, and wherein the electrical interconnects are disposed in the vias.

16. The integrated circuit of claim 15, wherein the protecting layer is exposed in one or more of the vias.

17. The integrated circuit of claim 15, wherein:
a silicide layer disposed over the source region and the drain region;
a nitride layer formed over the sidewall spacers and the silicide layer;
wherein the nitride layer is disposed between the first dielectric layer and the sidewall spacers and the silicide layer; and
wherein the surface of the silicide layer is exposed in the vias.

* * * * *